United States Patent
Wu et al.

(10) Patent No.: US 7,033,187 B2
(45) Date of Patent: Apr. 25, 2006

(54) ELECTRICAL CONNECTION AND COMPONENT ASSEMBLY FOR CONSTITUTION OF A HARD DISK DRIVE

(75) Inventors: Li Xing Wu, Dongguan (CN); Liu Jun Zhang, Dongguan (CN)

(73) Assignee: SAE Magnetics (H.K.) Ltd., Shatin (HK)

( * ) Notice: Subject to any disclaimer, the term of this patent is extended or adjusted under 35 U.S.C. 154(b) by 0 days.

(21) Appl. No.: 10/765,313

(22) Filed: Jan. 26, 2004

(65) Prior Publication Data

US 2005/0042894 A1 Feb. 24, 2005

(30) Foreign Application Priority Data

Aug. 21, 2003 (CN) ...................... PCT/CN03/00700

(51) Int. Cl.
*H01R 12/00* (2006.01)

(52) U.S. Cl. ........................................ 439/77; 439/493

(58) Field of Classification Search ................ 439/67, 439/77, 493; 360/245.9, 264.2
See application file for complete search history.

(56) References Cited

U.S. PATENT DOCUMENTS

| | | | | |
|---|---|---|---|---|
| 3,221,286 A | * | 11/1965 | Feede | 439/67 |
| 4,970,365 A | | 11/1990 | Chalco | 219/121.63 |
| 5,477,612 A | * | 12/1995 | Roberts | 29/846 |
| 5,742,484 A | * | 4/1998 | Gillette et al. | 361/789 |
| 5,744,759 A | * | 4/1998 | Ameen et al. | 174/260 |
| 5,938,453 A | * | 8/1999 | Ichimura | 439/67 |
| 6,002,589 A | * | 12/1999 | Perino et al. | 361/749 |

* cited by examiner

*Primary Examiner*—Khiem Nguyen
(74) *Attorney, Agent, or Firm*—Kenyon & Kenyon

(57) ABSTRACT

An electrical connection and a method of electrically coupling are disclosed. In one embodiment, a circuit substrate with a first set of circuitry has a bonding pad mounted to a surface of the circuit board. The bonding pad is electrically coupled to the first set of circuitry. A flexible circuit substrate with a second set of circuitry has a connecting pad mounted to a surface of the flexible circuit substrate facing the surface of the circuit board. The connecting pad is electrically coupled to the second set of circuitry. A ball of conductive material is mounted on the bonding pad. A clamping device presses the connecting pad to the ball of conductive material.

13 Claims, 7 Drawing Sheets

ELECTRICAL CONNECTION AND COMPONENT ASSEMBLY FOR CONSTITUTION OF A HARD DISK DRIVE

BACKGROUND INFORMATION

The present invention relates to magnetic hard disk drives. More specifically, the present invention relates to a method of electrically coupling a flexible circuit assembly to a circuit board.

FIG. 1 provides an illustration of a typical disk drive. The typical disk drive has a head gimbal assembly (HGA) configured to read from and write to a magnetic hard disk 101. The HGA and the magnetic hard disk 101 are mounted to the base 102 of a main board 103. The disk 101 is rotated relative to the base 102 by a spindle motor 104. The HGA typically includes an actuator arm 105 and a load beam 106. The HGA supports and positions a magnetic read/write slider 107 above the magnetic hard disk 101. The slider may contain transducers to perform the read/write function. The HGA is rotated relative to the base 102 along the axis of a pivot bearing assembly 108 by an actuator frame 109. The actuator frame 109 contains an actuator coil 110 driven by a magnet 111. A relay flexible printed circuit 112 connects a board unit 113 to the transducer of the magnetic read/write slider 107. The signal from the transducer is transmitted along the relay flexible printed circuit 112 via a printed circuit board (PCB) 114 coupled to the frame 109.

The flexible printed circuit assembly 112 can be electrically coupled to the PCB 114 using a number of different methods. FIG. 2 provides an illustration of one method of electrically coupling the flexible circuit assembly 112 to the PCB 114 according to the prior art. A flexible substrate 201 of the flexible printed circuit assembly 112 is positioned above a circuit substrate 202 of the PCB 114. The circuit substrate 202 can be rigid or flexible. In this case, a bonding pad 203 is mounted on the circuit substrate 202 and electrically coupled to circuitry within the PCB 114. A connecting pad 204 is mounted on the flexible substrate 201 and electrically coupled to circuitry within the flexible circuit assembly 112. The bonding pad 203 and connecting pad 204 are aligned. Then, a soldering bump 205 is placed upon the bonding pad 203 and the connecting pad 204. The soldering bump 205 can have a copper core 206. A heated tip 207 is then used to reflow the solder bumps 205. The tip 207 can be heated using a laser or ultrasonic energy. The tip 207 presses the flexible substrate 201 against the circuit substrate 202 for a set period of time, and the heat from the tip 207 melts the opposing solder bumps 205 together to form a bond. The copper cores 206 come into contact creating an electrical connection.

FIG. 3 provides an illustration of an alternate method of electrically coupling the flexible circuit assembly 112 to the PCB 114 according to the prior art. The flexible substrate 201 of the flexible printed circuit assembly 112 is positioned above the circuit substrate 202 of the PCB 114. The bonding pad 203 is mounted on the circuit substrate 202 and electrically coupled to circuitry within the PCB 114. The connecting pad 204 is mounted on the flexible substrate 201 and electrically coupled to circuitry within the flexible circuit assembly 112. In this case, the bonding pad 203 and the connecting pad 204 are coated with gold. An anisotropic conductive film (ACF) is applied to the bonding pad 203. The bonding pad 203 and the connecting pad 204 are aligned. Then the heated tip 207 presses the flexible substrate 201 against the circuit substrate 202 for a set period of time. The heat from the tip 207 melts the ACF to the connecting pad 204 to form a bond.

The use of the laser-heated tip 207 requires a great deal of precision. Additionally the tools required in performing this method are also quite costly. The accuracy required in the alignment process also greatly reduces the efficiency of these bonding processes.

DETAILED DESCRIPTION

An electrical connection and a method of electrically coupling are disclosed. In one embodiment, a circuit substrate with a first set of circuitry has a bonding pad mounted to a surface of the circuit board. The bonding pad is electrically coupled to the first set of circuitry. A flexible circuit substrate with a second set of circuitry has a connecting pad mounted to a surface of the flexible circuit substrate facing the surface of the circuit board. The connecting pad is electrically coupled to the second set of circuitry. A ball of conductive material is mounted on the bonding pad. A clamping device presses the connecting pad to the ball of conductive material. The interconnection of these bonding pads relaxes the tolerances required in aligning the connection pads with the bonding pads. This allows a certain amount of geometry tolerance or deformation and pad defects can be tolerated in the assembly process.

Figure 1:
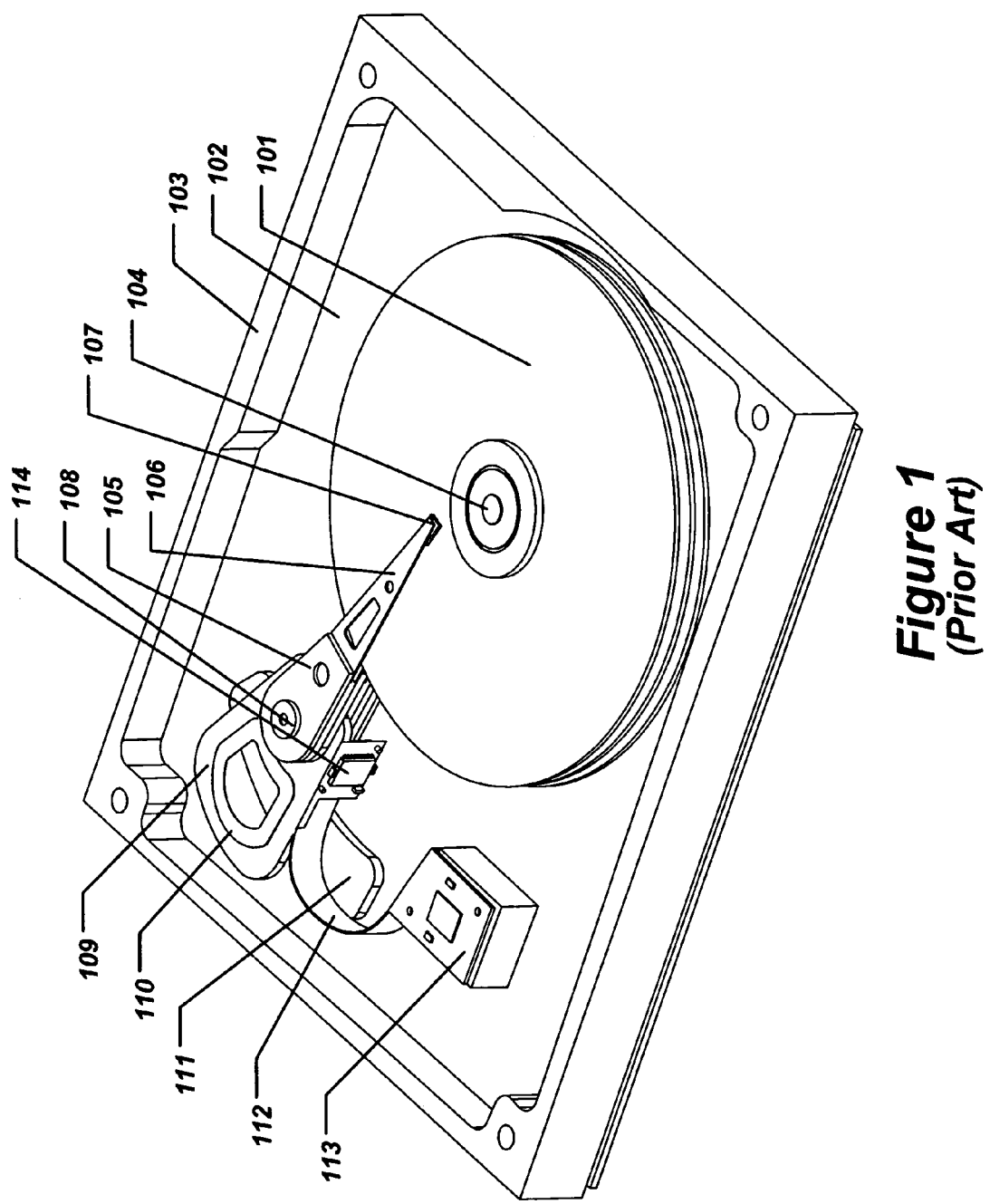
FIG. 1 provides an illustration of a typical disk drive.
Figure 2:
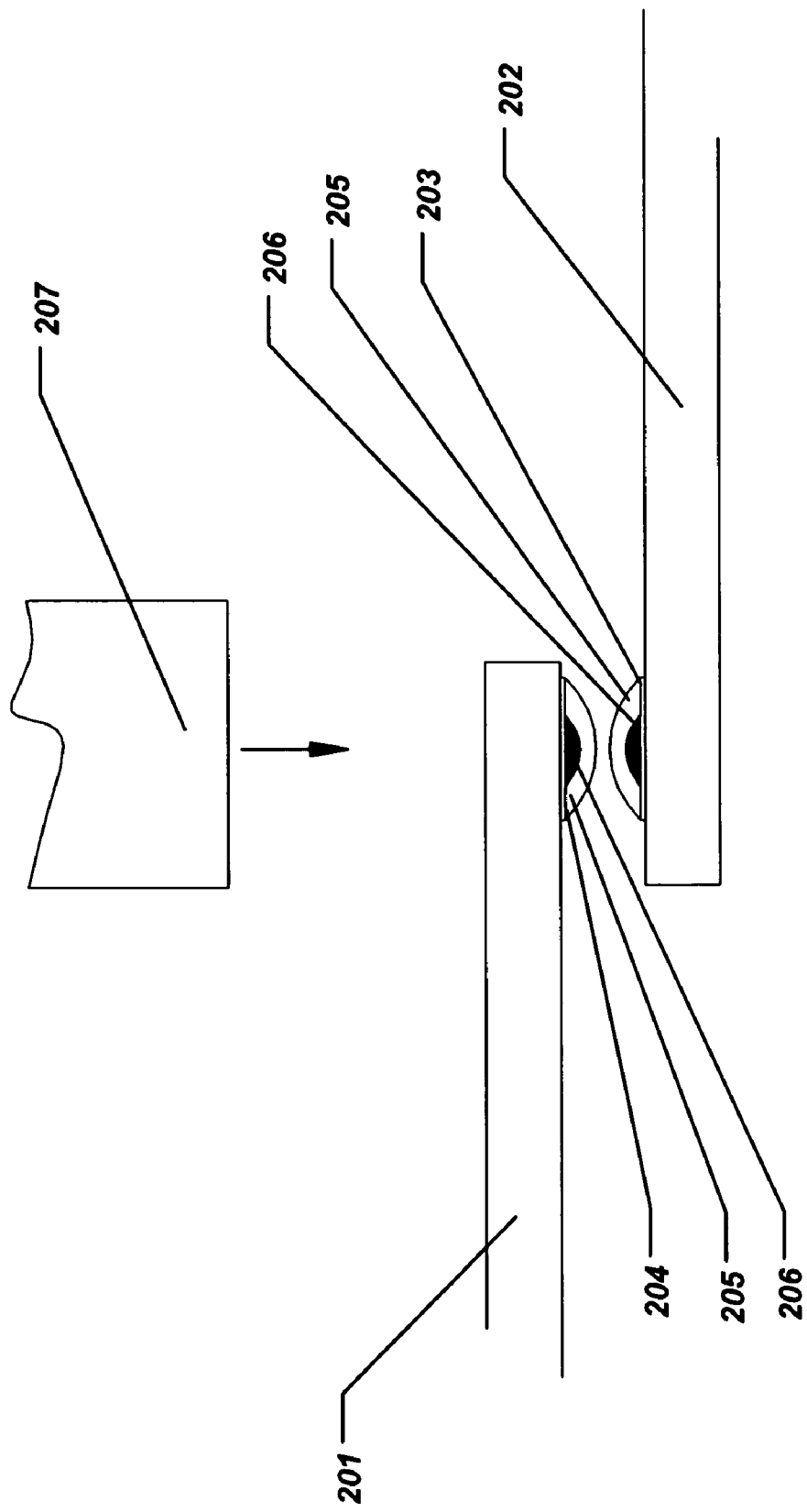
FIG. 2 provides an illustration of one method of electrically coupling the flexible circuit assembly to the PCB according to the prior art.
Figure 3:
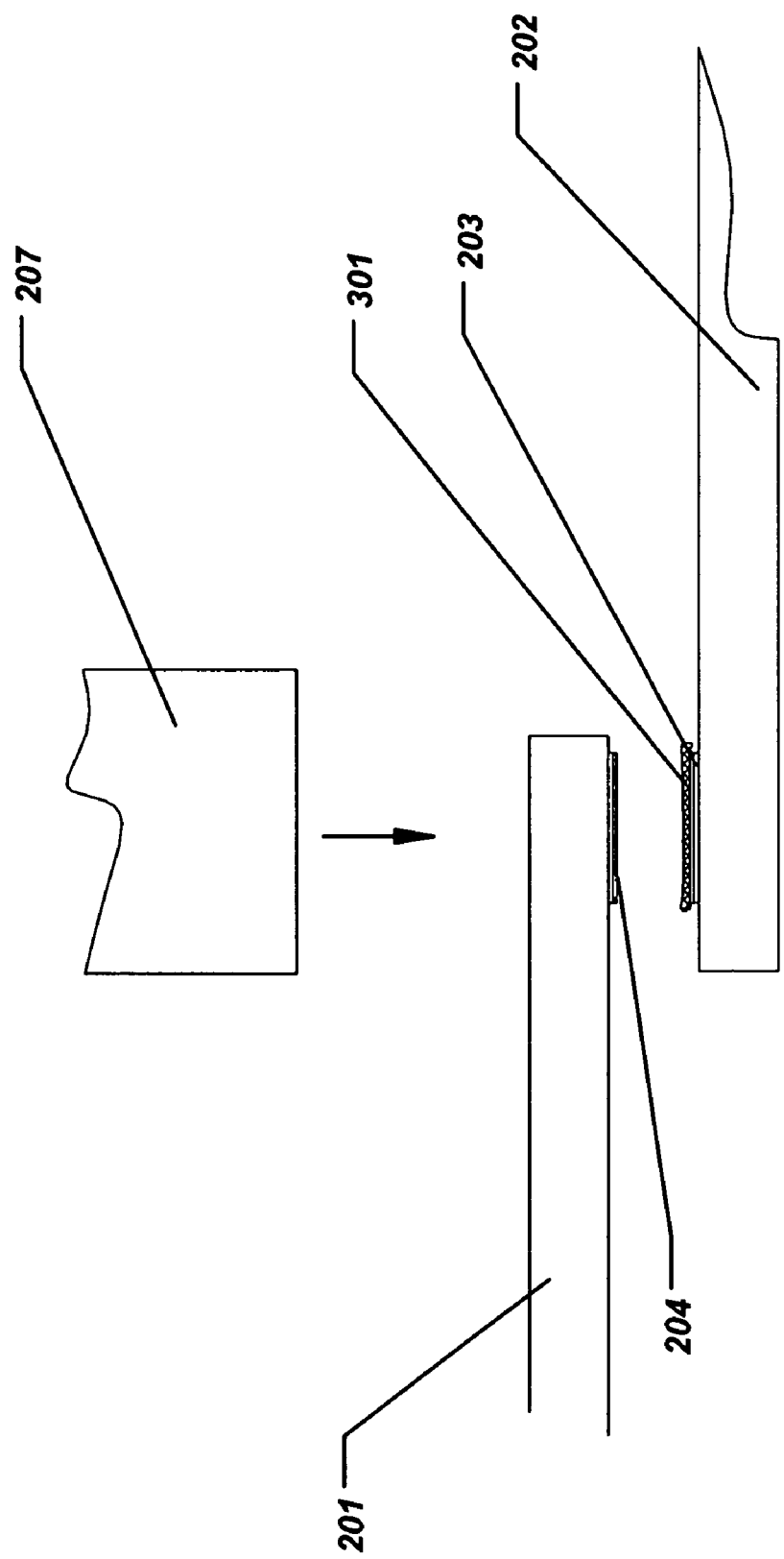
FIG. 3 provides an illustration of an alternate method of electrically coupling the flexible circuit assembly to the PCB according to the prior art.
Figure 4:
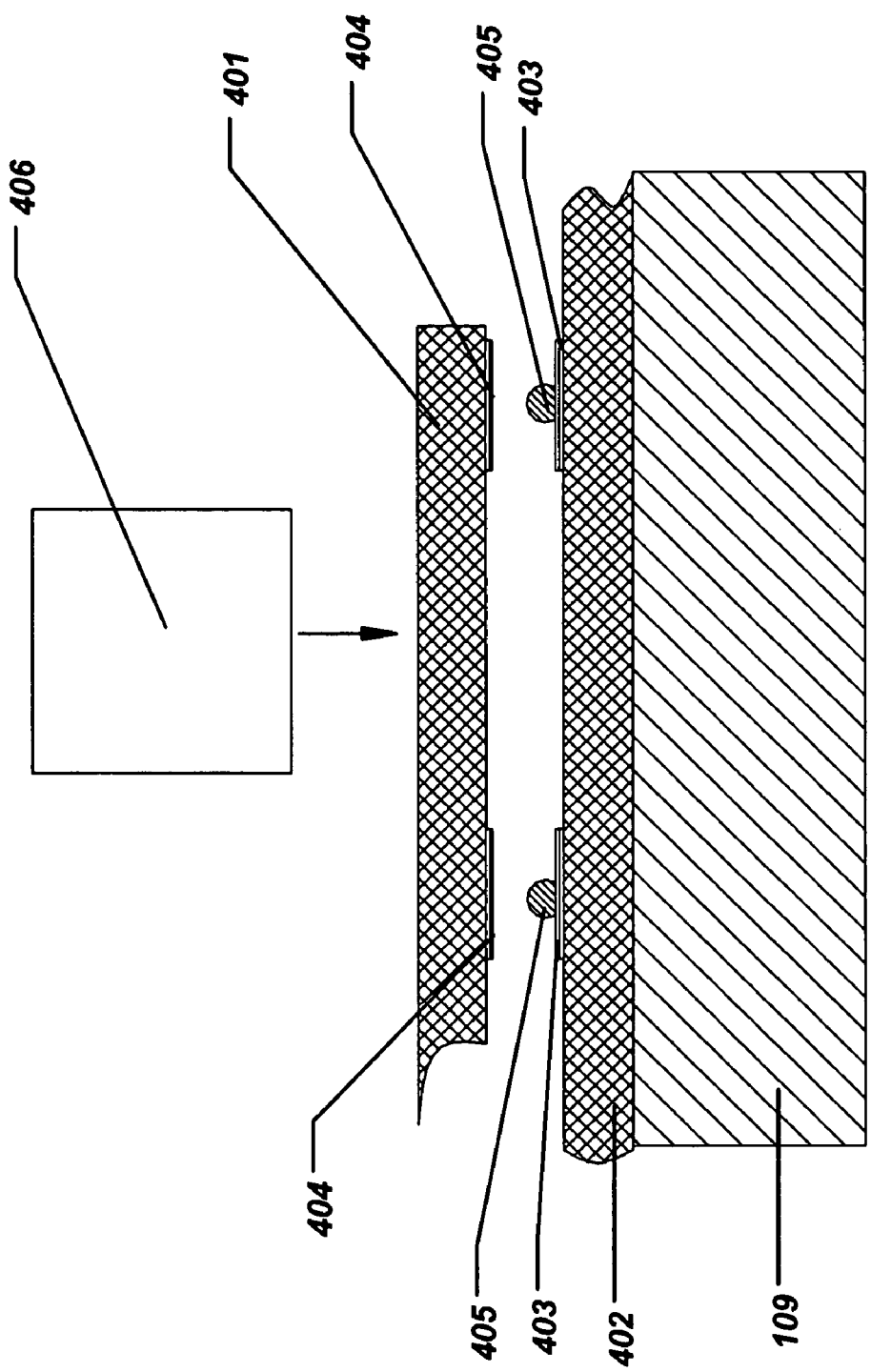
FIG. 4 provides an illustration of one embodiment of a process for electrically coupling the flexible circuit assembly to the printed circuit board according to the present invention.

FIG. 4 provides an illustration of one embodiment of a process according to the present invention for electrically coupling a flexible circuit assembly to the printed circuit board (PCB). A flexible substrate 401 of the flexible printed circuit assembly is positioned above a circuit substrate 402 of the PCB mounted to the actuator frame 109. The circuit substrate 402 can be rigid or flexible. The bonding pad 403 is mounted on the surface of the circuit substrate 402 and electrically coupled to circuitry within the PCB. The connecting pad 404 is mounted on the surface of the flexible substrate 401 facing the circuit substrate and electrically coupled to circuitry within the flexible circuit assembly. More than one bonding pad 403 can be mounted on the circuit substrate 402 and an appropriate number of connecting pads 404 can be mounted on the flexible substrate 401. The bonding pads 403 and connecting pads 404 can be made of gold, and are appropriately aligned. A ball of metallic material 405 is mounted to each bonding pad 403. The ball of metallic material 405 can be made of gold. Then, a clamping device 406 presses the connecting pads 404 into contact with the gold balls 405. The clamping device can include any of a variety of devices such as a screw and nut, a pin, or a clip. The gold ball 405 creates an electrical connection between the bonding pad 403 and the connecting pad 404.

Figure 5:
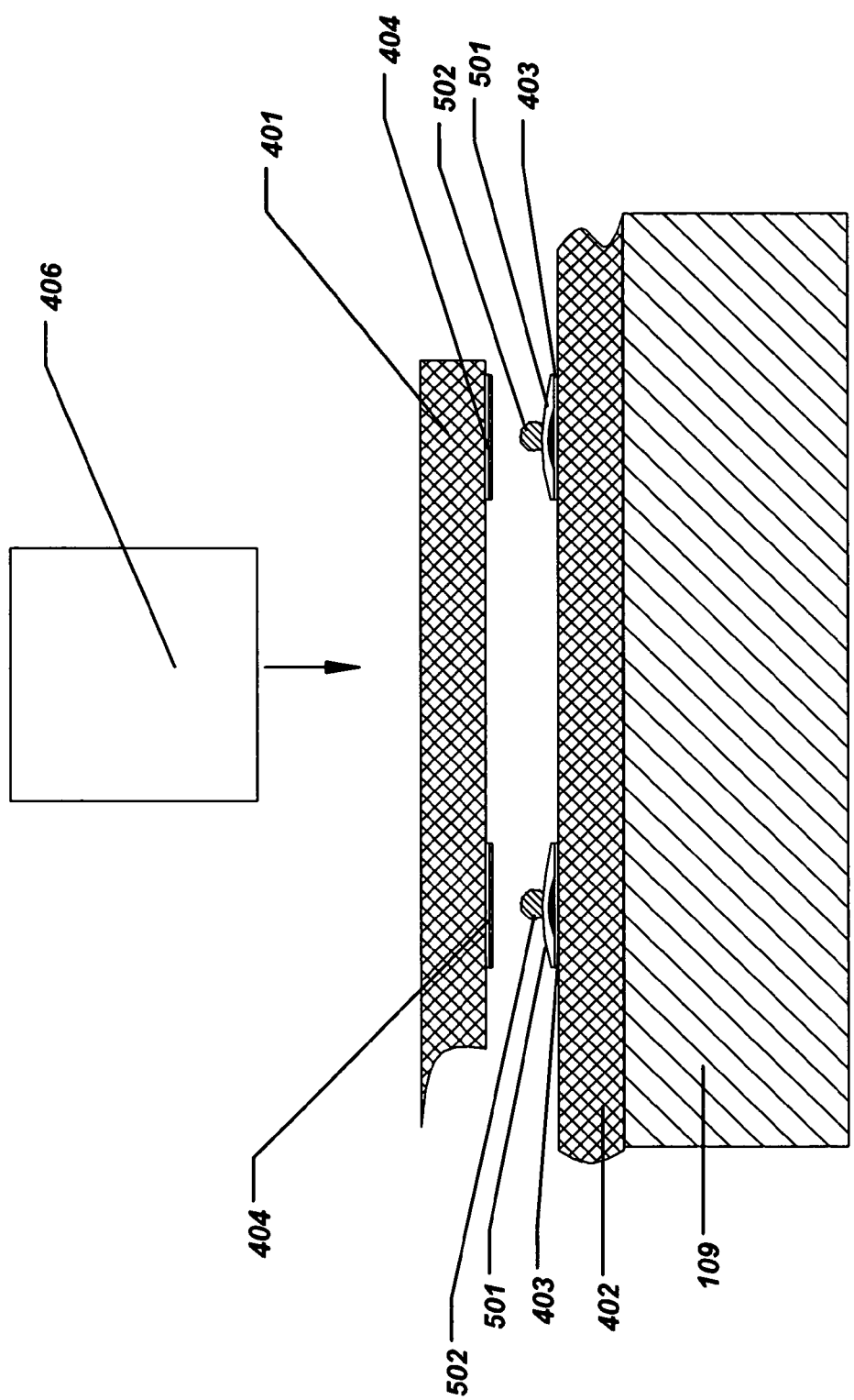
FIG. 5 provides an illustration of an alternate embodiment of a process for electrically coupling the flexible circuit assembly to the PCB according to the present invention.

FIG. 5 provides an illustration of an alternate embodiment of a process for electrically coupling the flexible circuit assembly to the PCB. The flexible substrate 401 of the flexible printed circuit assembly is positioned above the circuit substrate 402 of the PCB mounted to the actuator frame 109. The bonding pad 403 is mounted on the circuit substrate 402 and electrically coupled to circuitry within the PCB. The connecting pad 404 is mounted on the flexible substrate 401 and electrically coupled to circuitry within the flexible circuit assembly. More than one bonding pad 403 can be mounted on the circuit substrate 402 and an appropriate number of connecting pads 404 can be mounted on the flexible substrate 401. In this embodiment, the bonding pads 403 have solder bumps 501 with a copper core. The bonding pads 403 and connecting pads 204 are aligned. A solder ball 502 is mounted to each bonding pad 403. A clamping device 406 presses the connecting pads 404 into contact with the solder balls 502. As with the embodiment of FIG. 4, the clamping device 406 can include any of a variety of devices such as a screw and nut, a pin, or a clip. The solder ball 502 creates an electrical connection between the bonding pad 403 and the connecting pad 404.

Figure 6:
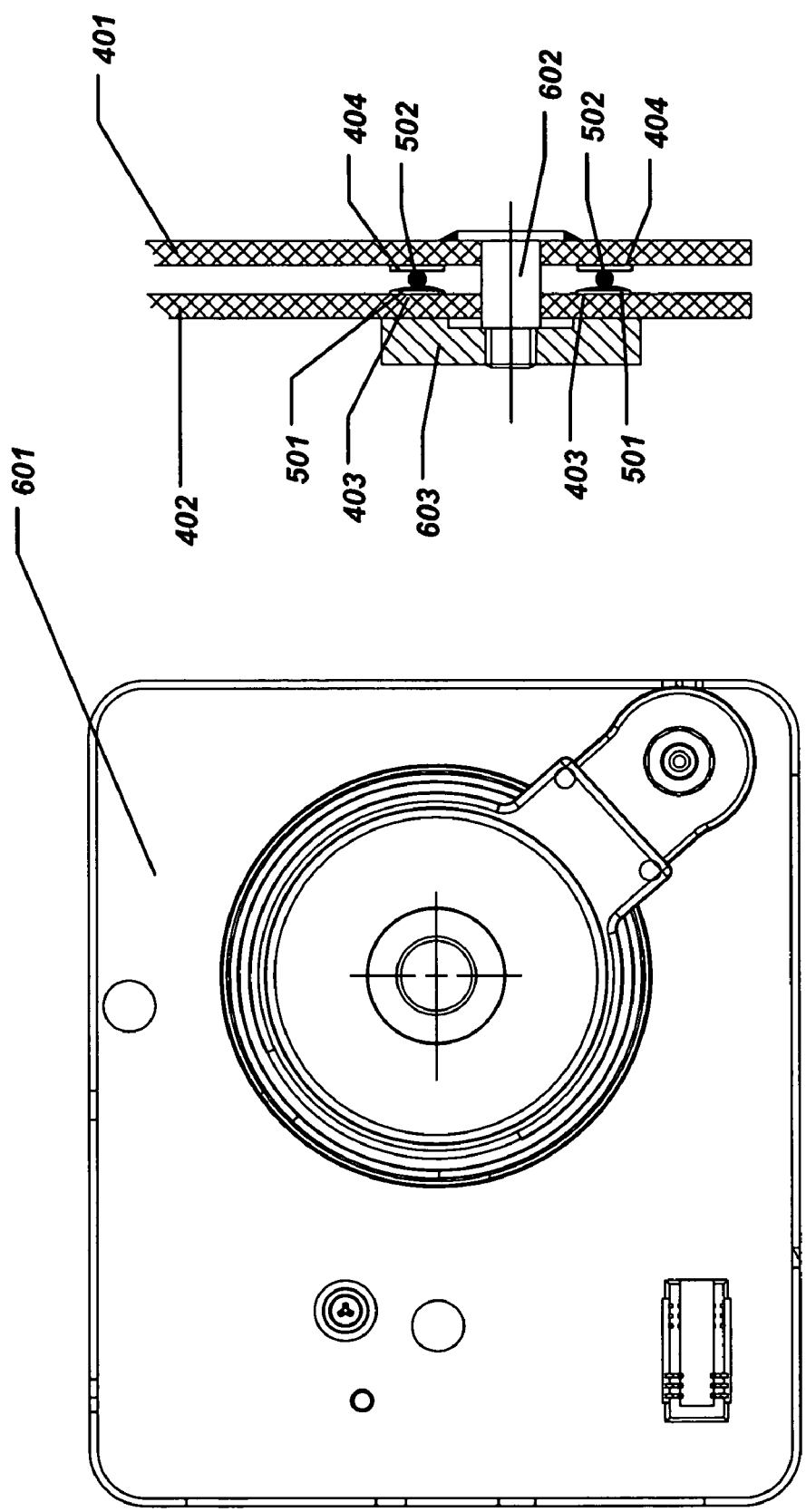
FIG. 6 provides a cross-sectional illustration of one embodiment of the electrical connection of a hard disk drive according to the present invention.

FIG. 6 provides a cross-sectional illustration of one embodiment of the electrical connection of a hard disk drive 601. A flexible substrate 401 of a flexible printed circuit assembly is positioned above a circuit substrate 402 of a PCB mounted to the actuator frame 109. The bonding pad 403 is mounted on the circuit substrate 402 and electrically coupled to circuitry within the PCB. The connecting pad 404 is mounted on the flexible substrate 401 and electrically coupled to circuitry within the flexible circuit assembly. More than one bonding pad 403 are mounted on the circuit substrate 402 and an equal number of connecting pads 404 are mounted on the flexible substrate 401. The bonding pads 403 have solder bumps 501 with a copper core. The bonding pads 403 and connecting pads 404 are aligned. A solder ball 502 is mounted to each bonding pad 403. In this embodiment, the connecting pads 404 are kept in contact with the solder ball 502 by a screw 602 and nut 603. This electrical connection can be used to electrically couple any two parts of the hard drive, such as the board unit to the spindle motor.

Figure 7:
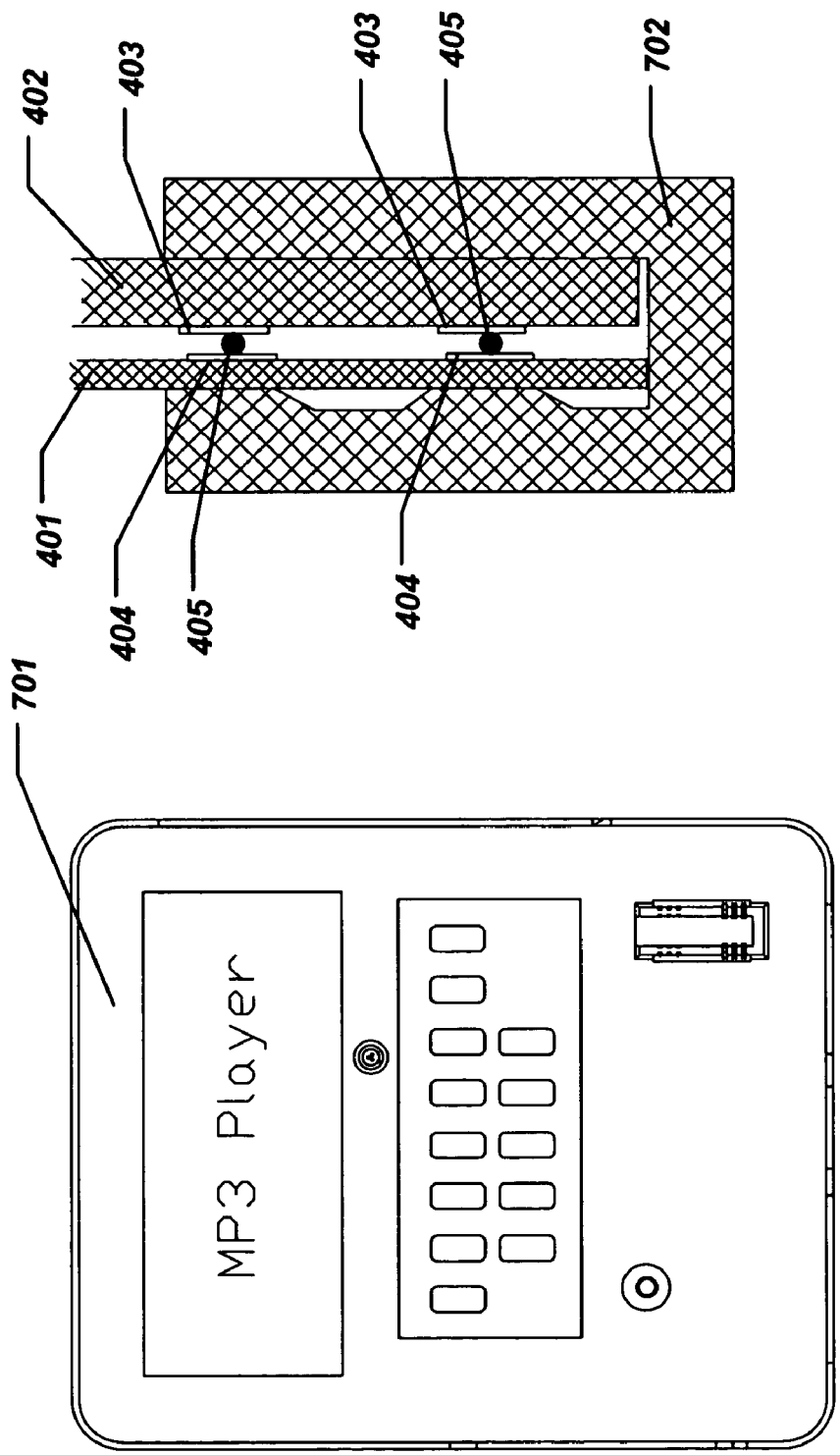
FIG. 7 provides a cross-sectional illustration of one embodiment of the electrical connection of an MP3 player according to the present invention.

FIG. 7 provides a cross-sectional illustration of one embodiment of the electrical connection of an MP3 player 701. The flexible substrate 401 of the flexible printed circuit assembly is positioned above the circuit substrate 402 of the PCB mounted to the actuator frame 109. The circuit substrate 402 can be rigid or flexible. The bonding pad 403 is mounted on the circuit substrate 402 and electrically coupled to circuitry within the PCB. The connecting pad 404 is mounted on the flexible substrate 401 and electrically coupled to circuitry within the flexible circuit assembly. More than one bonding pad 403 can be mounted on the circuit substrate 402 and an equal number of connecting pads 404 can be mounted on the flexible substrate 401. The bonding pads 403 and connecting pads 404 can be gold pads. The bonding pads 403 and connecting pads 404 are aligned. A gold ball 405 is mounted to each bonding pad 403. In this embodiment, the connecting pads 404 are kept in contact with the gold ball 405 by a spring clip 702.

What is claimed is:

1. A circuit assembly, comprising:
   a circuit substrate with a first set of circuitry;
   a bonding pad mounted to a surface of the circuit substrate electrically coupled to the first set of circuitry;
   a flexible circuit substrate with a second set of circuitry;
   a connecting pad mounted to a surface of the flexible circuit substrate facing the surface of the circuit board and electrically coupled to the second set of circuitry;
   a ball of conductive material mounted on the bonding pad; and
   a clamping device to press the connecting pad to the ball of conductive material.

2. The circuit assembly of claim 1, wherein the ball of conductive material is gold.

3. The circuit assembly of claim 1, wherein the ball of conductive material is solder.

4. The circuit assembly of claim 1, wherein the bonding pad is gold coated.

5. The circuit assembly of claim 1, wherein a solder bump is placed on the bonding pad.

6. The circuit assembly of claim 1, further comprising:
   a plurality of bonding pads coupled to the surface of the circuit substrate;
   a plurality of connecting pads coupled to the surface of the flexible circuit substrate facing the surface of the circuit board; and
   a ball of conductive material mounted on each bonding pad.

7. The circuit assembly of claim 1, wherein the clamping device is one of a group including a screw and nut, a pin, and a clip.

8. A method, comprising:
   mounting a bonding pad to a surface of a circuit substrate;
   electrically coupling a first set of circuitry of the circuit substrate;
   mounting a connecting pad to a surface of a flexible circuit substrate facing the surface of the circuit substrate;
   electrically coupling a second set of circuitry of the flexible circuit substrate;
   mounting a ball of conductive material on the bonding pad; and
   clamping the connecting pad to the ball of conductive material.

9. The method of claim 8, wherein the ball of conductive material is gold.

10. The method of claim 8, wherein the ball of conductive material is solder.

11. The method of claim 8, wherein the bonding pad is gold plated.

12. The method of claim 8, wherein a solder bump is placed on the bonding pad.

13. The method of claim 8, further comprising:
    coupling a plurality of bonding pads to the surface of the circuit board;
    coupling a plurality of connecting pads to the surface of the flexible circuit substrate facing the surface of the circuit substrate; and
    mounting a ball of conductive material on each bonding pad.

* * * * *